(12) United States Patent
Zetterlund

(10) Patent No.: US 6,943,967 B2
(45) Date of Patent: Sep. 13, 2005

(54) OPTICAL TRANSDUCER WITH FARFIELD MODIFIER

(75) Inventor: Erik Zetterlund, Solna (SE)

(73) Assignee: Zarlink Semiconductor AB, Jarfalla (SE)

(*) Notice: Subject to any disclaimer, the term of this patent is extended or adjusted under 35 U.S.C. 154(b) by 108 days.

(21) Appl. No.: 10/417,762

(22) Filed: Apr. 17, 2003

(65) Prior Publication Data
US 2004/0008917 A1 Jan. 15, 2004

(30) Foreign Application Priority Data
Apr. 19, 2002 (GB) ............................................. 0209016

(51) Int. Cl.[7] ................................................. G02B 7/02
(52) U.S. Cl. .................... 359/819; 359/811; 385/93; 372/92
(58) Field of Search ................. 359/819, 811, 359/652; 372/50, 92, 96, 101; 385/33, 88, 89, 90, 91, 92, 93, 94

(56) References Cited

U.S. PATENT DOCUMENTS

| 4,727,457 A | 2/1988 | Thillays |
| 5,500,768 A | 3/1996 | Doggett et al. |
| 5,757,830 A | 5/1998 | Liau et al. |
| 5,768,458 A | 6/1998 | Ro et al. |
| 6,421,474 B2 * | 7/2002 | Jewell et al. .................. 385/14 |
| 6,454,470 B1 * | 9/2002 | Dwarkin et al. ............... 385/93 |
| 6,550,983 B1 * | 4/2003 | Gilliland et al. .............. 385/93 |
| 6,610,563 B1 * | 8/2003 | Waitl et al. .................. 438/166 |
| 6,720,585 B1 * | 4/2004 | Wasserbauer et al. ......... 257/98 |

FOREIGN PATENT DOCUMENTS

| EP | 0 562 754 A1 | 9/1993 |
| EP | 0 587 277 A1 | 3/1994 |

* cited by examiner

Primary Examiner—Hung Xuan Dang
Assistant Examiner—Tuyen Tra
(74) Attorney, Agent, or Firm—Lawrence E. Laubscher, Jr.

(57) ABSTRACT

An optical transducer includes a light-emitting device with a light output that has an angular spatial intensity distribution exhibiting multiple peaks. A lens is closely coupled to the light-emitting device to reduce the angular spread of the spatial intensity distribution, preferably to a single peak on the optical axis. The lens is preferably a ball lens coupled to the light-emitting device by a refractive glue.

24 Claims, 3 Drawing Sheets

OPTICAL TRANSDUCER WITH FARFIELD MODIFIER

FIELD OF THE INVENTION

This invention relates to the field of photonics, and in particular to a light emitting device, such as a VCSEL (Vertical Cavity Surface Emitting Laser), with a device for modifying the farfield, and to a method of controlling the farfield in such a device. The "farfield" arises at a point far enough away for the spatial intensity distribution not to be significantly affected by the dimensions of the light-emitting device.

BACKGROUND OF THE INVENTION

Fiber optics is increasingly becoming the transport medium of choice for high-speed data communications. The VCSEL with its relatively low cost and high intensity output has made fiber optics readily available for use in local area networking applications. VCSELs however are typically multi-mode devices and are typically used with low cost multi-mode fibers, for example, plastic optic fibers.

The light output from a VCSEL must be efficiently coupled into an optic fiber. For this to occur, the beam divergence must be not greater than the acceptance angle of the fiber. A typical VCSEL has a farfield twin-peak output characteristic as shown in FIG. 1. In FIG. 1, the y-axis represents the power output and the x-axis represents the viewing angle. The different curves represent different output powers. It will be observed from FIG. 1 that at the highest output power, the VCSEL produces maximum output at angles of about 7.5° and 10° off the axis. There is a substantial dip in the power output along the axis. The total divergence of the output beam is about 26° for the highest output power, which is greater than the acceptance angle of the optic fiber. This makes coupling of the light output into an optic fiber inefficient because clearly if the optic fiber is aligned with the optical axis it will not receive the maximum output power, and if the alignment is optimized for one lobe it will not receive much power from the other. The off-axis alignment of the output power also encourages less efficient multi-mode propagation in the optic fiber.

A further problem arises from the fact that the light output distribution changes with changing output powers of the VCSEL. For example, it will be observed that as the output power is reduced, the left peak shifts to the right. In FIG. 1, the second highest output power has a left peak at about 5°. This further complicates the design of the coupling into the optic fiber.

The changing spatial distribution of output power also has another undesirable effect. Most VCSELs are provided with a power monitor in the form of a PIN diode that receives light reflected off the output lens of the device. If the angular spatial intensity distribution changes with output power, the power monitoring becomes non-linear because the intensity seen by the PIN diode is affected not only by the reduction in output power, but also by the fact that the intensity in the angular direction that is reflected back to the power monitor changes with drive current.

SUMMARY OF THE INVENTION

According to the present invention there is provided an optical transducer comprising a light emitting device having a light output with an angular spatial intensity distribution that exhibits multiple peaks; a lens mounted in front of said light emitting device in close proximity thereto; and an optical coupling medium coupling said light emitting device to said lens to reduce the angular spread of the spatial intensity distribution.

The lens reduces the angular spread of the spatial intensity distribution and can also reduce the dependence thereof on output power.

The lens is preferably a convex lens such as a ball lens coupled to the light-emitting device, typically a VCSEL, by a refractive glue that may or may not have the same refractive index as the ball lens. If the glue has the same refractive index as the ball lens, only the top surface of the ball lens is active in refracting the light, whereas if the refractive glue has a different refractive index, both surfaces are active.

Ball lenses are known for the purpose of focusing light from optic fibers. For example, one example of a ball lens is found in U.S. Pat. No. 5,768,458, the contents of which are incorporated herein by reference. Such lenses have not been closely integrated into VCSEL structures for the purpose of reducing the angular spread of the spatial intensity distribution.

It has been found quite remarkably that with the structure in accordance with the invention, the farfield can be made to have a Gaussian like single peak angular spatial distribution, with the single peak close to the optical axis. The divergence of the beam can be substantially reduced, typically by a factor of about 2. This beam is much better suited for coupling into an optical fiber. The efficiency of the coupling can be greatly increased. By choosing different refractive indices of the ball lens, the farfield can be tailored to suit individual requirements. For example, the divergence angle of the beam can be matched to the numerical aperture of the fiber into which it is to be coupled.

The distance between the ball lens and the light-emitting device, the refractive index of the ball lens, as well as the diameter of the ball lens can be varied. This distance is typically of the same order of magnitude as the dimensions of the active light emitting part of the light-emitting device, for example, a few microns.

The ball lens can conveniently be mounted on a support formed on a chip or a hole etched into a chip containing the light emitting device. It is preferably formed on a wafer with the VCSEL as part of a single integrated device.

The invention overcomes the problem that the divergence angle and shape of the farfield of an unmodified VCSEL change with drive current. This makes it easier to obtain good fiber coupling. Also, the power monitoring is proportional to the power emitted from the VCSEL because the angular distribution of power no longer changes with drive current. The change in power seen by the monitor diode results solely from reduced power output of the VCSEL.

In another aspect the invention provides a method of modifying the light output of a light emitting device with a light output having an angular spatial intensity distribution that exhibits multiple peaks, comprising mounting a lens in front of said light emitting device; and closely coupling said lens to said light emitting device with a refractive glue so that said lens reduces the angular spread of said spatial intensity distribution.

BRIEF DESCRIPTION OF THE DRAWINGS

The invention will now be described in more detail, by way of example only, with reference to the accompanying drawings, in which:—

DETAILED DESCRIPTION OF THE PREFERRED EMBODIMENTS

Figure 1:
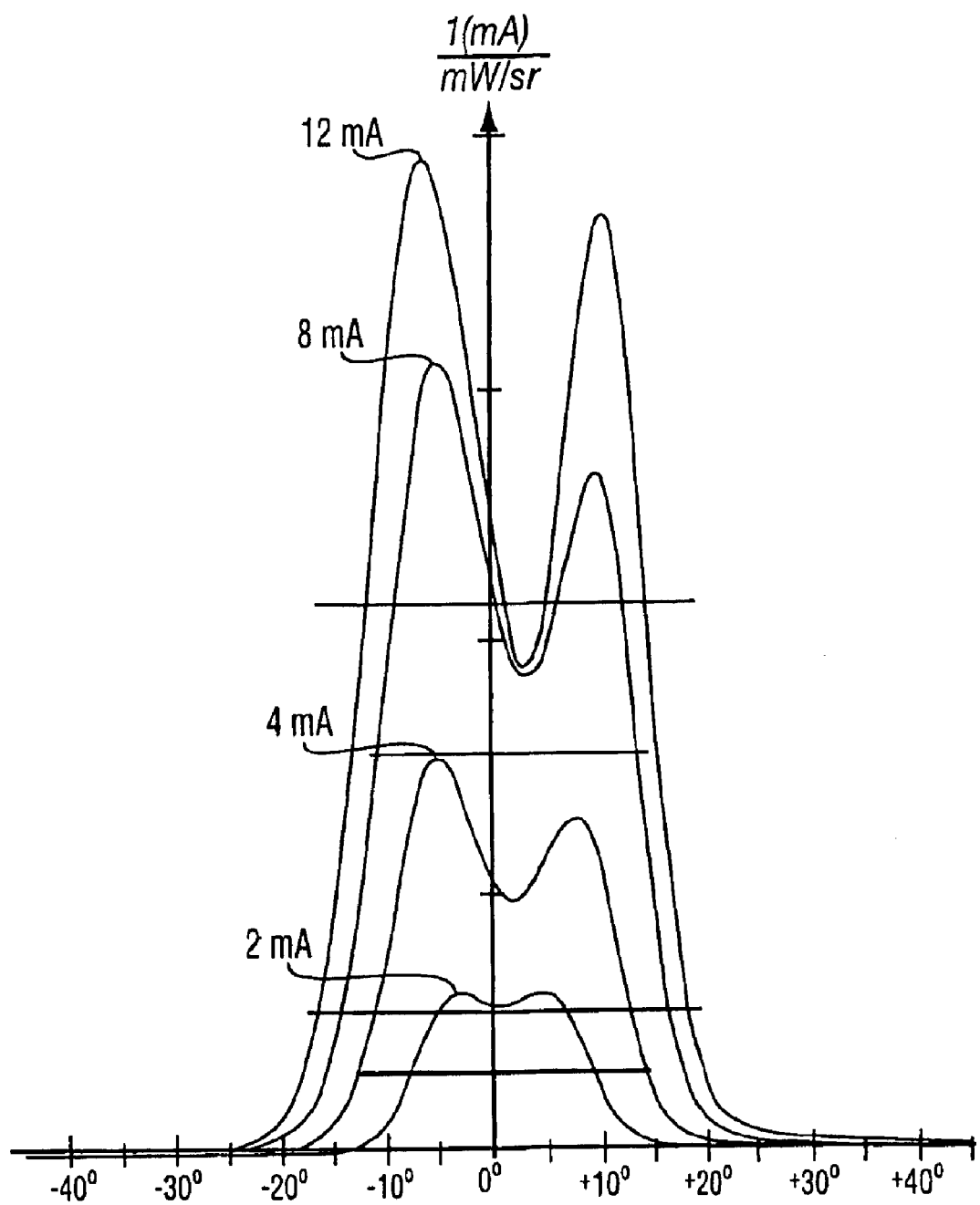
FIG. 1 is a graph showing the angular spatial intensity distribution of a prior art VCSEL.
Figure 2:
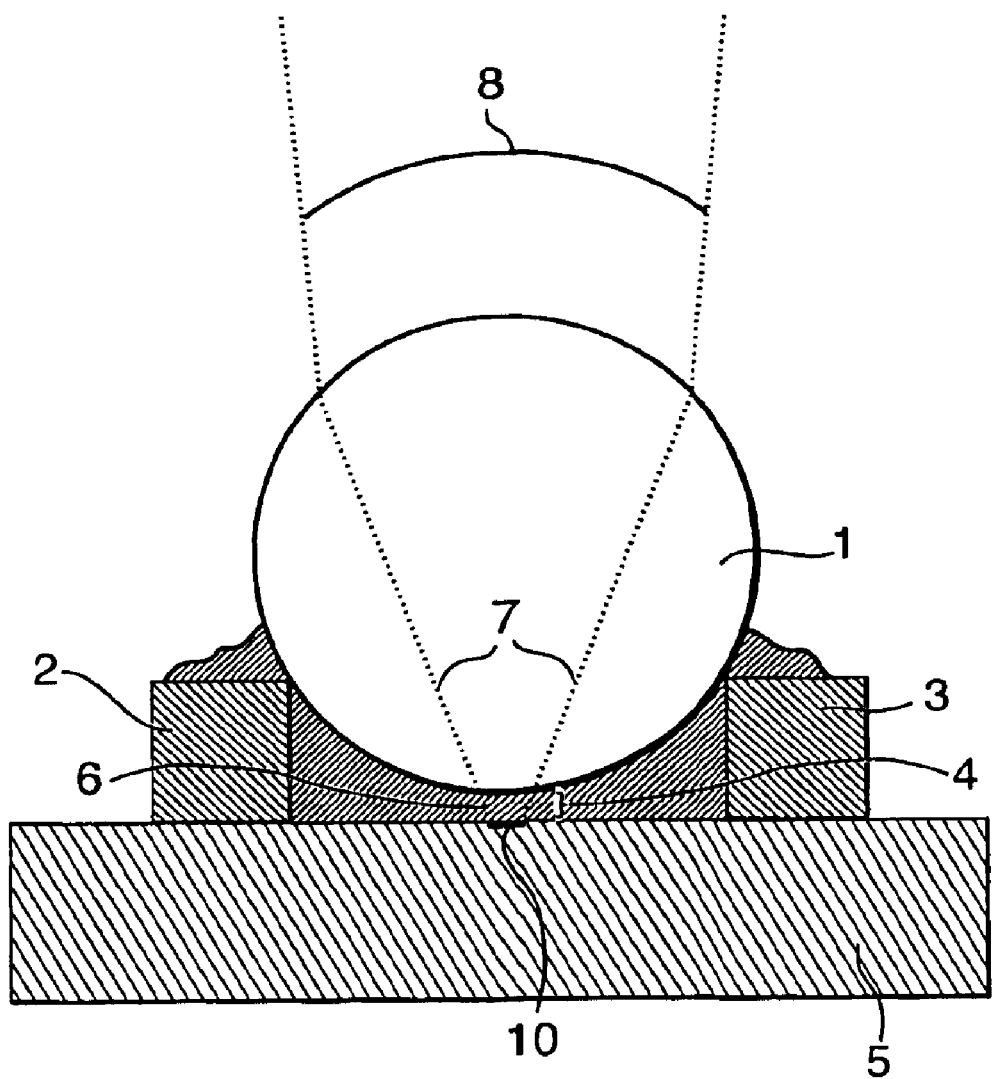
FIG. 2 is a schematic diagram of an optical transducer in accordance with a preferred embodiment of the invention.

Referring now to FIG. 2, the optical transducer comprises a VCSEL chip 5 having an active light-emitting region 10. Typically, this VCSEL would exhibit the angular spatial distribution characteristics shown in FIG. 1, namely a pair of peaks on either side of the optic axis that shift with changing output powers.

An annular support 3 is formed on the chip 5, in this example by high precision lithography. The support 3 can be made from polyimide, BCB, or photoresist. The support 3 is normally formed during the wafer fabrication process, although it can be formed later.

A ball lens 1, typically made of quartz ($SiO_2$) and having a diameter of about 350 μm is mounted on the annular support 3 so as to lie in close proximity to the active region 10, and spaced from it by a small distance 4 that can be adjusted to control the output characteristics of the device. The ball lens is retained in position by an optical glue 2, typically a silicone glue, which fills the void between the ball lens and the surface of the chip 5.

Light from the active region 10 initially has a divergence 6. It quickly strikes the ball lens 1, where it may or may not be refracted by the lower surface depending on whether the refractive glue 2 has the same refractive index as the ball lens. The light has a divergence 7 within the ball lens 1. After exiting the ball lens, the light has a divergence 8 into air, nitrogen or other suitable gas.

Figure 3:
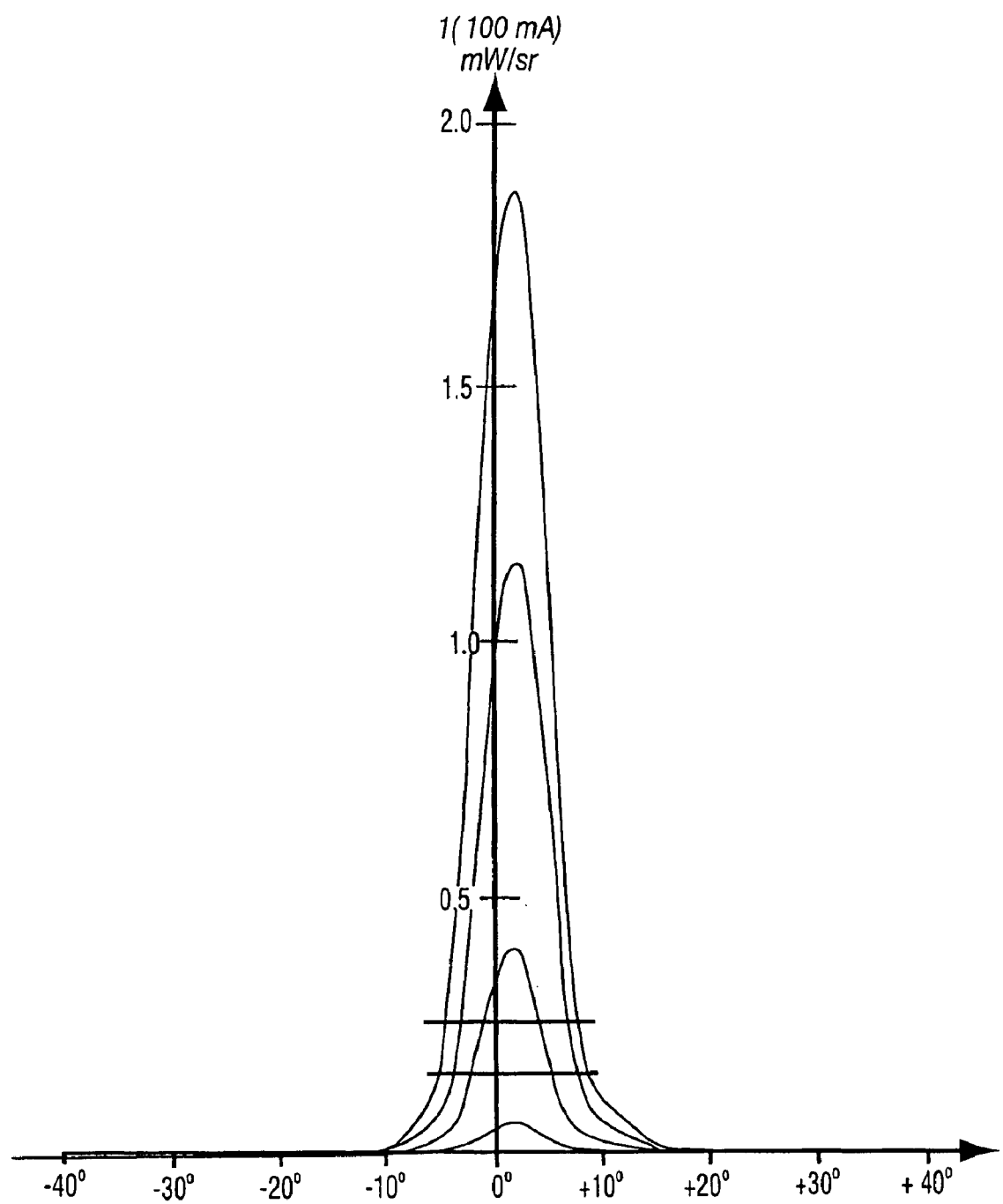
FIG. 3 is a graph showing the angular spatial intensity distribution of the optic transducer shown in FIG. 2.

By suitably adjusting the position of the ball lens, it is found remarkably that the light output from the ball lens has a Gaussian-like spatial distribution as shown in FIG. 3. The twin peaks of FIG. 1 have been reduced to a single peak, just slightly off the optical axis at about 2.5°. Additionally, it will be noted that as the output power changes, the position of the peak does not change significantly. This is a very important result because the small constant angular offset can easily be accounted for in the alignment of the fiber. The amount of power coupled into the fiber for a VCSEL of given power is significantly increased. It will be noted that the output of the transducer exhibits single mode like properties with a narrow beam divergence, so the efficiency of the device can be greatly improved. In the example given, the beam divergence for the maximum power output has been reduced to about 12°. A multimode VCSEL in accordance with the invention can even be used with a single mode fiber because of the single lobe and narrow divergence angle, which is within the acceptance angle of a single mode fiber. This is a considerable advantage also because a typical LED for a single mode fiber only has an output power in the order of 2 μwatts, whereas a VCSEL in accordance with the invention can have a power in the order of 500–1000 μwatts, thus considerably enhancing the effectiveness of the single mode fiber. The reflections within the single mode fiber act to further enhance only one mode of propagation.

It will be appreciated the described ball lens is closely integrated into the VCSEL device itself. Typically, the distance between the ball lens and the light-emitting region 10 of the VCSEL 5 is in the order of a few μm.

The linearity of the power monitoring is greatly improved because the angular distribution of the power reflected back to the monitor diode not depend on drive current as is the case in FIG. 1. Thus, the change in power seen by the monitor diode is directly related to the actual change in power output of the VCSEL.

If desired a conventional output lens can also be provided, although such a lens may not be necessary. Although the invention is intended for a stand-alone VCSEL, it can if desired be applied to an array of VCSELs.

The invention has been described with reference to a VCSEL, but it is application to other light emitting devices with beam divergence, such as LEDs and RCLEDs.

One skilled in the art will appreciate that the above description is exemplary only, and many other embodiments are possible within the scope of the appended claims.

What is claimed is:

1. An optical transducer comprising:
    a multi-mode light emitting device formed in a chip, said chip having a light-emitting region, and said light emitting device having an output with an angular spatial intensity distribution that exhibits multiple peaks;
    a lens mounted on said chip in front of said light emitting region and in close proximity thereto;
    an optical coupling medium coupling said light emitting region to said lens; and
    wherein said lens is spaced a distance in the order of a few microns from said light emitting region such that said multiple peaks are reduced to a single peak by said lens.

2. An optical transducer as claimed in claim 1, wherein said lens is a ball lens.

3. An optical transducer as claimed in claim 2, wherein said optical coupling medium is a refractive glue.

4. An optical transducer as claimed in claim 3, wherein said refractive glue has the same refractive index as said ball lens.

5. An optical transducer as claimed in claim 4, wherein said refractive glue has a different refractive index from said ball lens.

6. An optical transducer as claimed in claim 3, wherein said refractive glue is silicone.

7. An optical transducer as claimed in claim 2, wherein said ball lens is mounted on said chip by means of a support integrated onto said chip.

8. An optical transducer as claimed in claim 7, wherein said support is an annular support.

9. An optical transducer as claimed in claim 7, wherein said support is made from a material selected from the group consisting of: polyamide, BCB, and photoresist.

10. An optical transducer as claimed in claim 2, wherein said light emitting device is a VCSEL.

11. An optical transducer as claimed in claim 2, wherein said light emitting device is formed on a chip, and said ball lens is mounted on a hole etched into said chip.

12. An optical transducer as claimed in claim 2, wherein said ball lens is made of quartz.

13. An optical transducer as claimed in claim 1, wherein the diameter of said lens is about 350 mm.

14. A method of modifying the light output of a light emitting device formed in a chip having a light emitting region, said light emitting device having a light output with an angular spatial intensity distribution that exhibits multiple peaks, said method comprising:
    mounting a lens on said chip in front of said light emitting region at a distance in the order of a few microns therefrom;
    closely coupling said lens to said light emitting device with a refractive glue so and setting the position of the lens at a distance from said light emitting region such that said lens reduces said multiple peaks to a single peak.

15. A method as claimed in claim 14, wherein said lens is a ball lens.

16. A method as claimed in claim 15, wherein said ball lens is made of quartz.

17. A method as claimed in claim 15, wherein said refractive glue has the same refractive index as said ball lens.

18. A method as claimed in claim 15, wherein said refractive glue has a different refractive index from said ball lens.

19. A method as claimed in claim 15, further comprising integrating a support onto said chip, and mounting said ball lens on said support.

20. A method as claimed in claim 19, wherein said support is formed by high precision lithography.

21. A method as claimed in claim 19, wherein said support is made of a material selected from the group consisting of: polyamide, BCB, and photoresist.

22. A method as claimed in claim 16, further comprising etching a recess into said chip over said light emitting region, and mounting said ball lens on said recess.

23. A method as claimed in claim 14, wherein said refractive glue is silicone.

24. A method as claimed in claim 14, wherein said light emitting device is a VCSEL.

* * * * *